United States Patent [19]

Ishikawa et al.

[11] Patent Number: 5,146,170

[45] Date of Patent: Sep. 8, 1992

[54] METHOD AND APPARATUS FOR LOCATING AN ABNORMALITY IN A GAS-INSULATED ELECTRIC DEVICE

[75] Inventors: Toshio Ishikawa; Shuzuo Iwaasa; Tomoaki Utsumi; Fumihiro Endo, all of Hitachi

[73] Assignee: Hitachi, Ltd., Tokyo, Japan

[21] Appl. No.: 535,069

[22] Filed: Jun. 8, 1990

[30] Foreign Application Priority Data

Jun. 14, 1989 [JP] Japan .................................. 1-149428

[51] Int. Cl.$^5$ ............................................ G01R 31/11
[52] U.S. Cl. ...................................... 324/536; 324/514; 324/520; 324/532; 324/544
[58] Field of Search .............. 324/536, 537, 544, 551, 324/514, 532, 535, 520

[56] References Cited

U.S. PATENT DOCUMENTS

| | | | |
|---|---|---|---|
| 3,370,022 | 2/1968 | Bader et al. | 324/536 X |
| 3,430,136 | 2/1969 | Brustle et al. | 324/520 X |
| 3,869,665 | 3/1975 | Kenmochi et al. | 324/536 X |
| 4,385,271 | 5/1983 | Kurtz et al. | 324/536 X |
| 4,446,402 | 5/1984 | Drouet | 324/536 X |
| 4,882,682 | 11/1989 | Takasuka et al. | 324/536 X |
| 4,975,800 | 12/1990 | Oshita et al. | 324/520 X |

FOREIGN PATENT DOCUMENTS 136661 8/1984 Japan .
245976 10/1987 Japan .
107174 4/1989 Japan .

OTHER PUBLICATIONS

Lightle et al., Sixth International Symposium on High Voltage Engineering, "Monitoring of GIS at Ultra High Frequency", (Aug. 1989).

Primary Examiner—Kenneth A. Wieder
Assistant Examiner—Glenn W. Brown
Attorney, Agent, or Firm—Antonelli, Terry, Stout & Kraus

[57] ABSTRACT

A method and apparatus for locating an abnormality in a gas-insulated electric device, operative to locate the spot of an insulation abnormality, which emerges inside a metallic container, from outside of said metallic container. A plurality of detectors ($S_0$–$S_n$) disposed at certain positions in the metallic container produce detected signals, from which spectrum strengths (YH) in a high frequency band of 500 MHz or above are evaluated, and a position which renders a maximum spectrum strength is calculated from the relation between the spectrum strengths and the installation positions of the detectors and is determined to be the spot (x) of partial discharge.

16 Claims, 14 Drawing Sheets

METHOD AND APPARATUS FOR LOCATING AN ABNORMALITY IN A GAS-INSULATED ELECTRIC DEVICE

BACKGROUND OF THE INVENTION

This invention relates to a method and apparatus for locating an abnormality in a gas-insulated electric device, operative to determine the spot of an insulation abnormality, which occurs inside a metallic container, from outside of the metallic container.

When a gas-insulated electric device having a high-voltage conductor supported by being insulated within a metallic container filled with insulation gas has developed an insulation abnormality and is left intact, it can result in such a serious accident as insulation breakdown. Therefore, it is necessary to locate, from outside of the metallic container, the abnormality at the stage of its symptom such as the emergence of a partial discharge, thereby taking appropriate counter measures. For this purpose, there have been proposed various methods and apparatus for locating abnormalities in gas-insulated electric devices.

An example of proposals, as disclosed in Japanese Patent Unexamined Publication No. 62-245976, employs a plurality of detectors disposed inside the metallic container and operates to locate an abnormality on the basis of the difference in propagation time of abnormality signals detected by the detectors. The electric device abnormality detection system of this example comprises detection units each made up of a reactor, which is disposed in each of contiguous metallic containers interleaved by insulation segments and adapted to detect a voltage generated by a partial discharge, and a measuring unit connected across the reactor, and a location confinement unit which confines the spot of partial discharge on the basis of the timing relationship of the detected signals provided by the detection units. Voltages created across the reactors of detection units due to a partial discharge are detected by the associated measuring units, and they produce detected signals of different timings for the spot confinement unit, which then confines the spot of abnormality based on the time differences of the detected signals.

Another example proposed in Japanese Patent Unexamined Publication No. 59-136661 is designed to locate an abnormality by detecting a discharge light emission which emerges at the occurrence of a partial discharge. The detection system of this example comprises a plurality of optical conductors disposed by the interior surface of a cylindrical sealed container, in which a gas-insulated conductor is accommodated, along the longitudinal direction of the container, and each having a light receptive end surface at a position different among the light conductors, a transparent protective member fitted on the sealed container to cover the exterior section of the light conductors, a receiving electrode made of a porous plate material which covers the exterior section of the protective member, and a signal lead-out device which leads the signal from the electrode and the signals from the light conductors out of the sealed container. This arrangement is capable of detecting a partial discharge at a virtually constant sensitivity irrespective of its location along the axis of the gas-insulated electric device, and locating the spot of discharge.

A further example, which is proposed in the proceeding of the 19th Electrical Insulation Material Symposium held from Sep. 30 until Oct. 1, 1986, entitled "Insulation diagnosis for a conduit air electric transmission line using AE sensors", is designed to detect the sound of collision of a foreign object thereby to locate the spot of incident.

However, the conventional methods and apparatus for locating an abnormality in a gas-insulated electric device, as described above, do not impart the spot of abnormality with a satisfactory accuracy. Depending on the location of a partial discharge and its severity, prompt inspection of the spot of abnormality is required in some cases, and the inspection and recovery activities for the abnormality must be done as quick and less influence on the power supply operation as possible. On this account, the accurate location of the spot of abnormality is needed, which however cannot be accomplished by use of the conventional methods and apparatus for locating abnormalities. Moreover, it is not possible for the conventional methods and apparatus to locate a very small partial discharge, which is still harmful depending on the cause of incident and its location, and therefore a more sensitive method and apparatus for locating the spot of abnormality have been desired.

SUMMARY OF THE INVENTION

A prime object of this invention is to provide a method and apparatus for locating an abnormality capable of detecting accurately the spot of a partial discharge.

Another object of this invention is to implement the location of an abnormality in a gas-insulated electric device by using a minimal number of detectors.

A further object of this invention is to implement the location of an abnormality in a device associated with a gas-insulated electric device.

A further object of this invention is to locate an abnormality in a gas-insulated electric device and repair the abnormality.

In order to achieve the above objectives, the inventive method features to get the spectrum strength, in a high-frequency band above 500 MHz, of signals detected by a plurality of detectors disposed in certain positions in the metallic container, and to locate the spot of partial discharge which renders the maximum spectrum strength from the relation between the spectrum strengths and the positions of the detectors.

In order to achieve the above objectives, the inventive apparatus features to comprise a plurality of detectors disposed in certain positions inside the metallic container, means of analyzing the frequency spectrum of the signals detected by the detectors thereby to get each spectrum strength, and means of locating the spot of partial discharge which renders the maximum spectrum strength on the basis of the positions of detectors and respective spectrum strengths.

According to the inventive method of locating an abnormality, the propagation of an electromagnetic wave generated by a partial discharge in a wide range of the metallic container is detected with the detectors thereby to get the spectrum strengths. The electromagnetic wave has a property of attenuation by being affected by the wall resistance and the like in the metallic container, resulting in different spectrum strengths provided by the detectors depending on the distance from the spot of partial discharge to each detector. Accordingly, the location for the maximum spectrum strength can readily be calculated from the relation between the magnitudes of spectrum strength of detectors and the positions of detectors, and the spot of partial discharge can readily be located from it.

The inventive apparatus for locating an abnormality is arranged to include the above-mentioned means to locate the spot of partial discharge based on the spectrum strength, and therefore it operates accurately to achieve the accurate location of abnormality by discriminating noises emerging from nearly portions.

DESCRIPTION OF THE PREFERRED EMBODIMENTS

Embodiments of this invention will be described with reference to the drawings.

Figure 1:
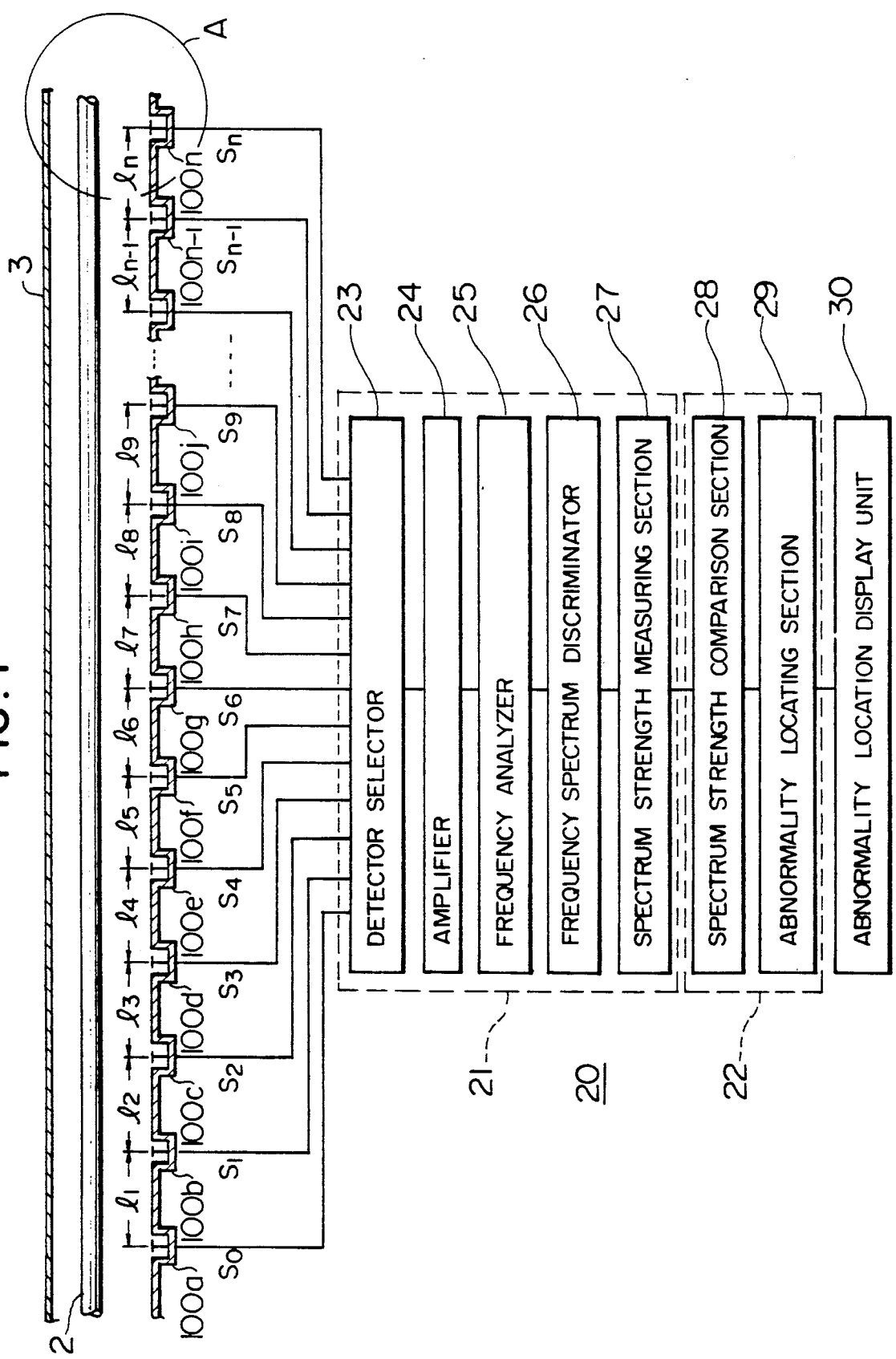
FIG. 1 is a block diagram showing the first embodiment of the inventive apparatus for locating an abnormality in a gas-insulated electric device.
Figure 2:
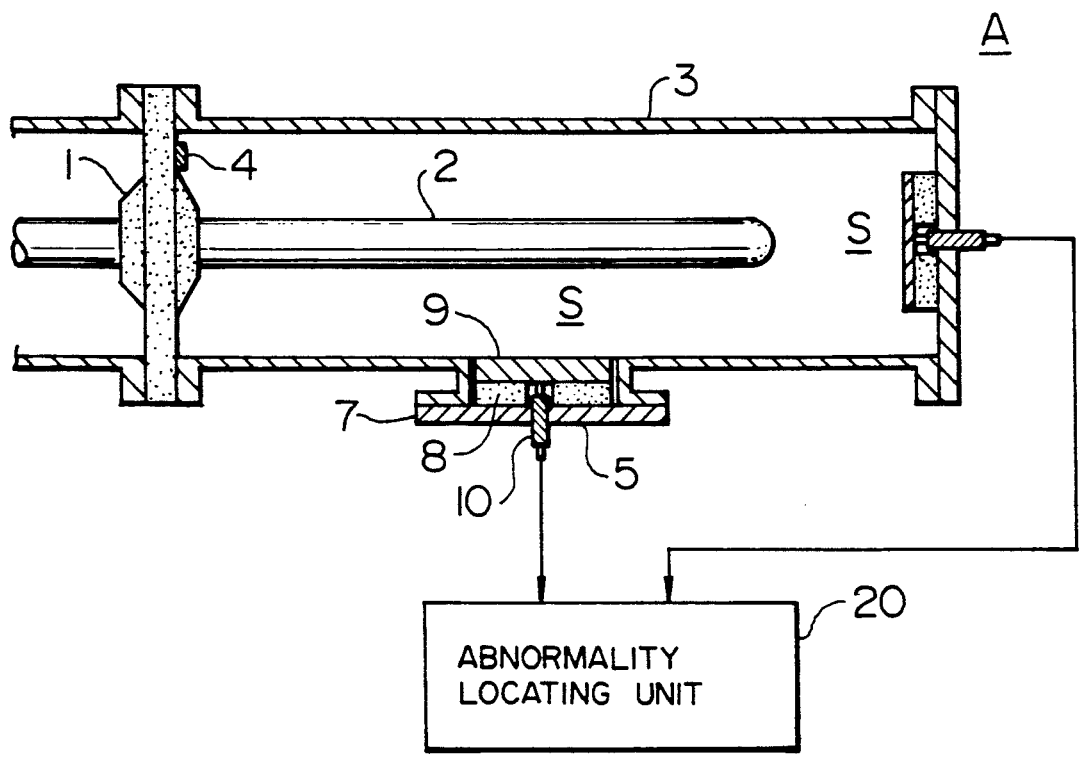
FIG. 2 is a diagram showing in detail by enlargement the principal portions of FIG. 1.

FIG. 1 shows the abnormality locating apparatus for a gas-insulated electric device, in which the present invention is applied to one phase of gas-insulated bus conductors known as a gas-insulated electric device. FIG. 2 is an enlarged detailed diagram for portion A in FIG. 1. In FIG. 1, a tubular metallic container 3 is filled with insulation gas of $SF_6$ or the like, and it accommodates a high-voltage conductor 2, which is supported by an insulation support member such as an insulation spacer. Provided inside the metallic container 3 are a plurality of detectors $S_0$-$S_n$ located at positions $100a$-$100n$ spaced out by distances $l_1$-$l_n$ between adjoining ones, respectively.

As shown in FIG. 2 for the details of each detector S, the metallic container 3 has the formation of a hand hall 5 closed by an end plate 7, which supports on the interior side thereof a detection electrode 9 through an insulator 8. The detection electrode 9 is insulated electrically from the end plate 7 by means of an insulation terminal 10 which serves to lead out the signal of the electrode to the outside of the metallic container 3 for connection to an abnormality locating unit 20. The detection electrode 9 is fitted to confront the high-voltage conductor 2 which is supported by an insulation support member 1 inside the metallic container 3.

The abnormality locating unit 20 comprises, in addition to the detectors $S_0$-$S_n$ shown in FIG. 1, a means 21 of evaluating the spectrum strength, a means 22 of locating the spot of abnormality which renders the maximum spectrum strength based on the relation between the spectrum strengths of detectors and the positions of detectors, and a display unit 30 for displaying the spot of abnormality.

The spectrum strength evaluation means 21 is designed to amplify the signals of the detectors $S_0$-$S_n$ with an amplifier 24, all at once or one at a time cyclically by receiving the output from a detector selection section 23, analyze the frequency components of the detected signal with a frequency analysis section 25, judges with a frequency spectrum judgement section as to whether or not the frequency spectrum includes an abnormality signal in the high-frequency band, and evaluate the spectrum strength of the abnormality signal with spectrum strength measuring section 27.

The abnormality locating means 22 is designed to evaluate the maximum spectrum strength on the basis of the comparison among spectrum strengths of abnormality signals from all detectors implemented by a spectrum strength comparison section 28, and locate the spot of abnormality among the detector positions which renders the maximum spectrum strength as implemented by an abnormality locating section 29. The result of locating operation can be presented in various ways, and it is displayed on the display unit 30 in this embodiment.

Figure 3:
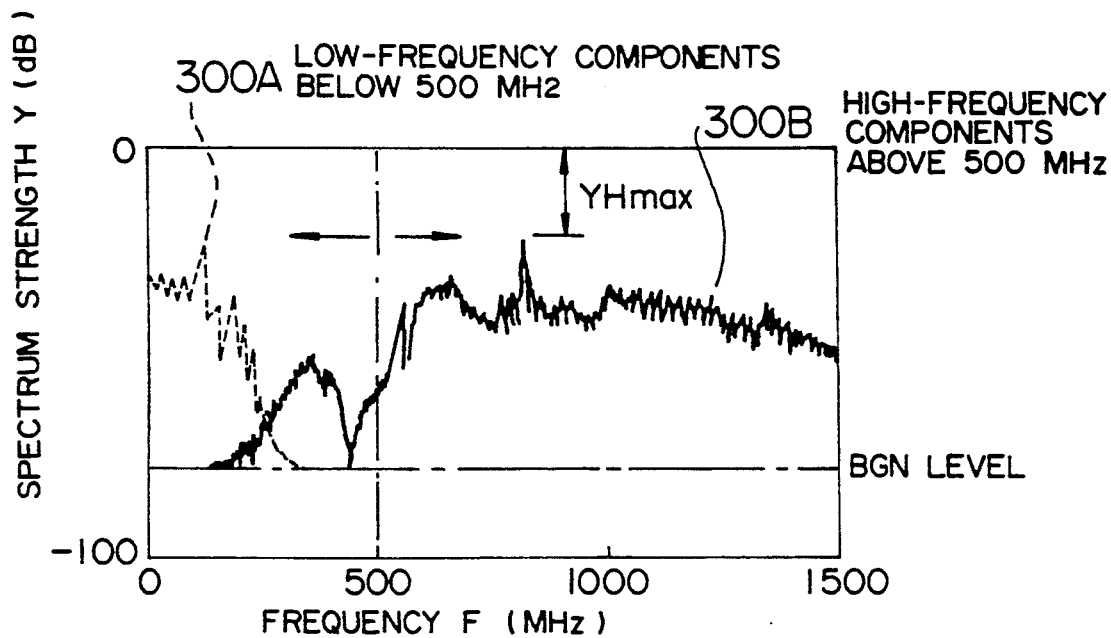
FIG. 3 is a characteristic graph of the frequency spectrum used to explain the present invention.

In the abnormality locating unit 20 arranged as described above, the partial discharge signal is discriminated on the basis of the pattern of frequency spectrum as shown in FIG. 3. A partial discharge emerging in the metallic container 3 of the gas-insulated electric device produces wide frequency components from low frequencies to high frequencies as shown by the solid line in FIG. 3. The spectrum includes a large proportion of high-frequency components above 500 MHz as indicated by 300B, whereas extraneous noises such as partial discharges emerging outside of the gas-insulated electric device are represented by a spectrum 300A including a large proportion of low-frequency components below 500 MHz as indicated by the dashed line. Accordingly, the emergence of an internal discharge can be predicated in response to the presence of high-frequency components above 500 MHz in the spectrums of the signals provided by the detectors. Based on this principle, the means 21 in FIG. 1 evaluates the spectrum strength $YH_{max}$ of high-frequency components in the signals provided by the detectors $S_0$-$S_n$ all at once or one by one cyclically.

Figure 4:
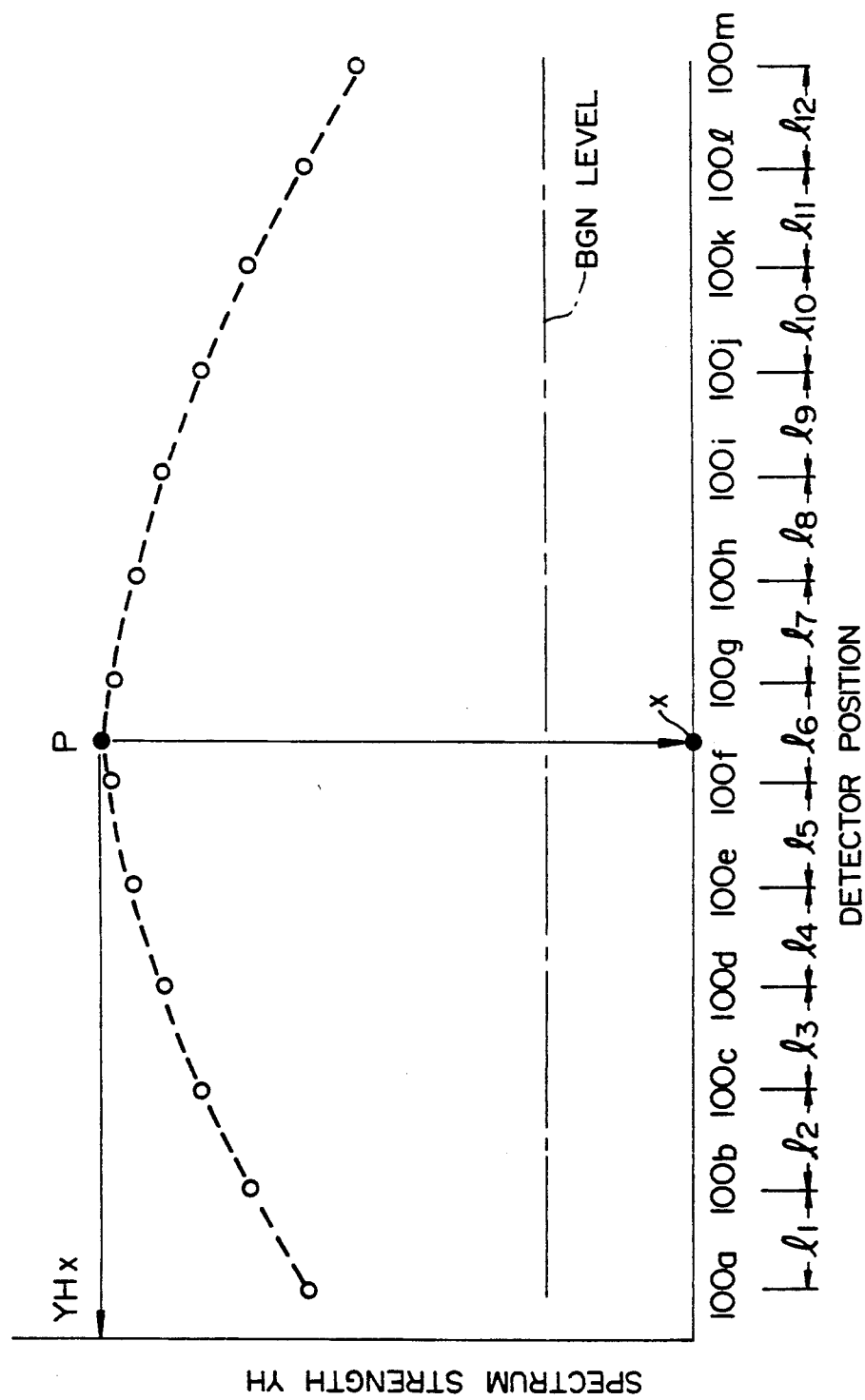
FIG. 4 is a diagram showing the inventive method of abnormality location based on the use of many detectors.

FIG. 4 is a diagram showing the inventive abnormality locating method of the case of using many detectors. The means 22 shown in FIG. 1 subsequently determines a point P of maximum spectrum strength from a distribution curve of $YH_{max}$'s with respect to the positions of detectors, i.e., from the envelope curve of the peak values of spectrum strengths provided the detectors, by such a method as the least square method, as shown in FIG. 4, thereby to determine the point P to be the spot x of partial discharge. At the same time, it is possible to determine the magnitude $YH_x$ of the partial discharge.

Although FIG. 4 shows the envelope curve resulting from the detection of a relatively large partial discharge of the order of several hundred pC (pico-coulomb), the electromagnetic wave signal produced by such a large partial discharge is propagated in a wide range of the metallic container and therefore detected by many detectors, allowing easy determination of the maximum spectrum strength point P owing to the envelope curve based on many detected signals and thus easy location of the spot x of partial discharge. On the other hand, the electromagnetic wave signal produced by a small partial discharge is attenuated to the level of background noise (BGN) in a certain distance from the spot of partial discharge, and therefore only part of detectors closed to the partial discharge can detect it. Locating methods based on relatively small numbers of detected signals are also useful, and they will be explained in the following.

Figure 5:
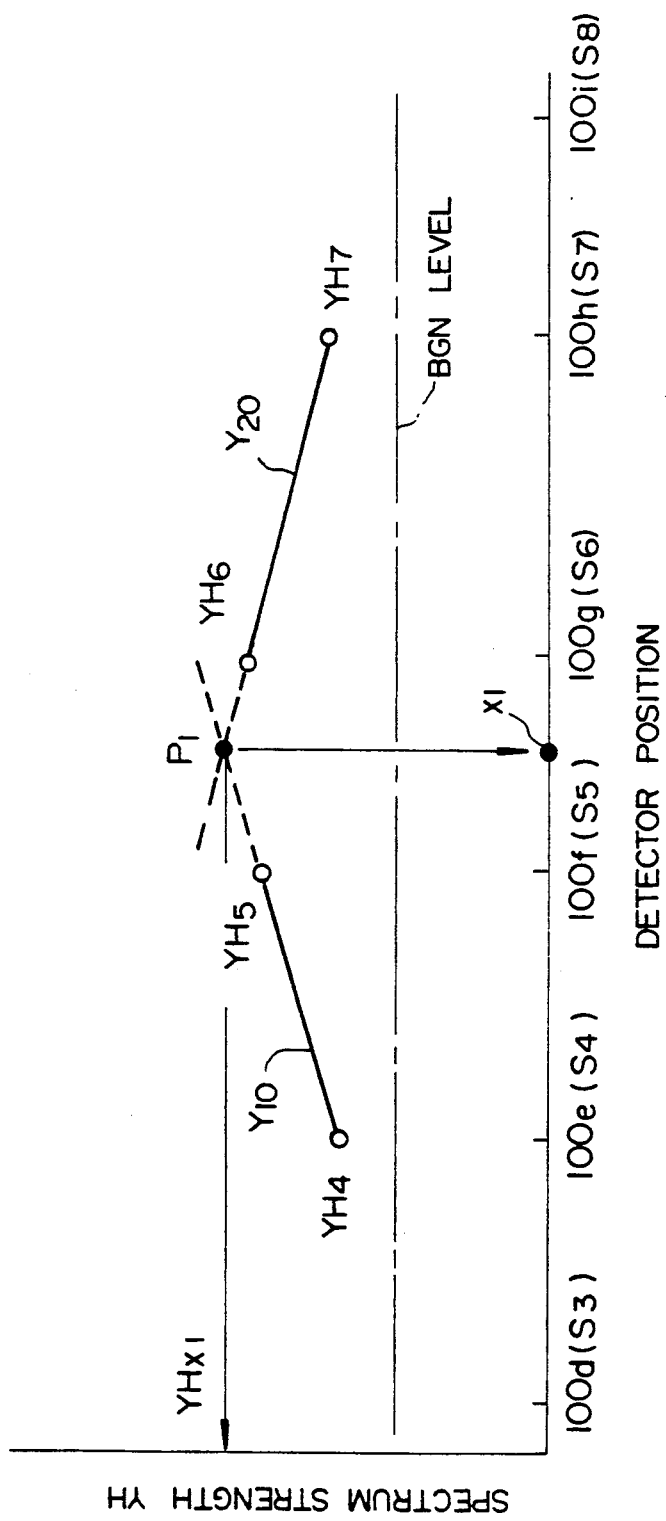
FIG. 5 is a diagram showing the inventive method of abnormality location based on the use of four detectors.

FIG. 5 shows a method of abnormality location of the case where a small partial discharge is detected by only four detectors $S_4$-$S_7$ disposed at positions 100e-100h. A line $Y_{10}$ connecting the spectrum strengths $YH_{4max}$ and $YH_{5max}$ provided by the detectors $S_4$ and $S_5$ at positions 100e and 100f and a line $Y_{20}$ connecting the spectrum strengths $YH_{6max}$ and $YH_{7max}$ provided by the detectors $S_6$ and $S_7$ at positions 100g and 100h are extended to form an intersection point $P_1$, which gives a presumed maximum spectrum strength, allowing a point $x_1$ corresponding to the $P_1$ to be determined as the spot of partial discharge which has a magnitude of $YH_{x1}$.

Figure 6:
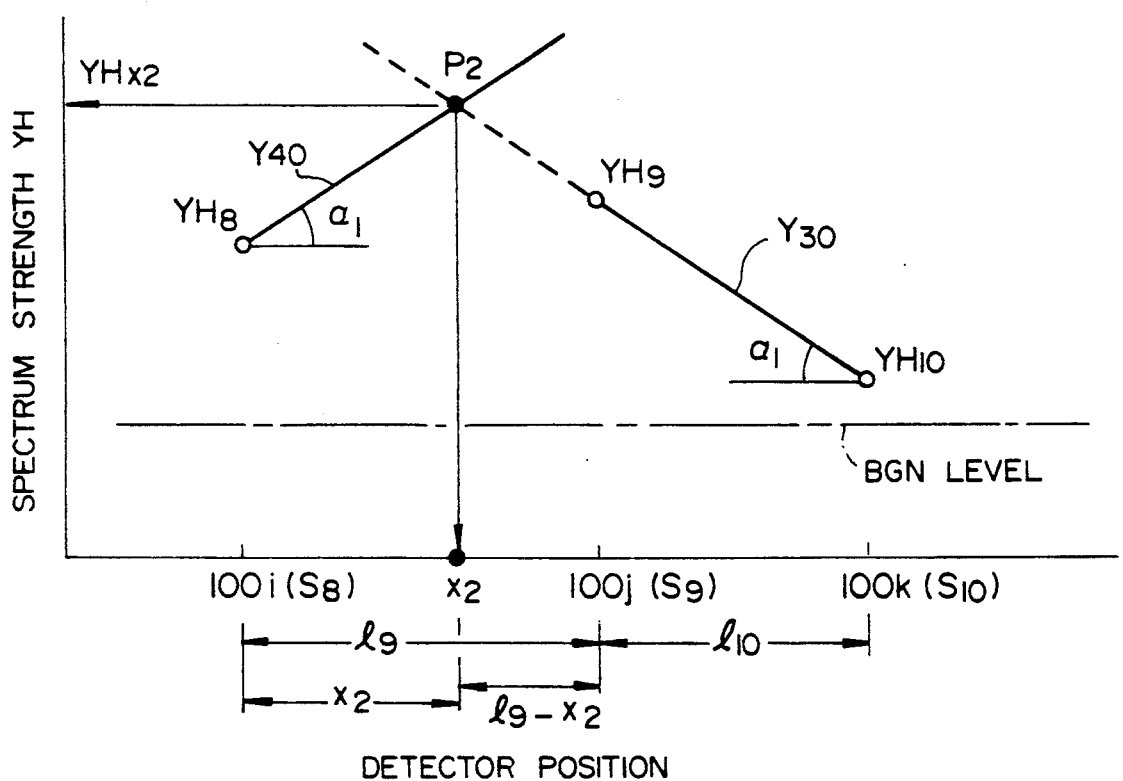
FIG. 6 is a diagram showing the inventive method of abnormality location based on the use of three detectors.

FIG. 6 shows a method of abnormality location of the case where the number of partial discharge detectors which detect a partial discharge further decreases to three. A small partial discharge is detected by detectors $S_8$, $S_9$ and $S_{10}$ at contiguous positions 100i, 100j and 100k, among the detectors disposed in the metallic container. Based on the spectrum strengths $YH_{8max}$, $YH_{9max}$ and $YH_{10max}$ at these positions and the distances $l_9$ and $l_{10}$ between these positions, the attenuation factor $a_1$ of the electromagnetic wave, which is generated by the partial discharge, in traveling inside the metallic container is calculated, and the spot of partial discharge is located by application of the measured value $a_1$.

It is assumed that the comparison of the detected signal levels of the three points has revealed: $YH_{9max} > YH_{8max} > YH_{10max}$. Next, the attenuation factor $a_1$ is evaluated from the largest spectrum strength $YH_{9max}$, the smallest spectrum strength $YH_{10max}$, and the distance $l_{10}$ between the detectors $S_9$ and $S_{10}$. By obtaining the intersection $P_2$ of the line $Y_{40}$, which is determined by the spectrum strength $YH_{8max}$ and the attenuation factor $a_1$, and the line $Y_{30}$ which connects the spectrum strengths $YH_{9max}$ and $YH_{10max}$ of the $S_9$ and $S_{10}$, the spot of partial discharge is located to be at point $x_2$ with a magnitude of $YH_{x2}$. The result of abnormality location explained above in the geometrical manner can readily be calculated as follows:

The following three equations result from FIG. 6.

$$\begin{cases} YH_{x2} - a_1 \cdot x_2 = YH_{8max} & (1) \\ YH_{x2} - a_1 \cdot (l_9 - x_2) = YH_{9max} & (2) \\ YH_{x2} - a_1 \cdot (l_9 + l_{10} - x_2) = YH_{10max} & (3) \end{cases}$$

Subtracting the equation (3) from equation (2) to get the attenuation factor $a_1$ results:

$$YH_{x2} - a_1 \cdot (l_9 - x_2) - \{YH_{x2} - a_1 \cdot (l_9 + l_{10} - x_2)\} =$$

$$YH_{9max} - YH_{10max}$$

$$a_1 \cdot l_{10} = YH_{9max} - YH_{10max}$$

$$\therefore a_1 = \frac{YH_{9max} - YH_{10max}}{l_{10}} \quad (4)$$

Next, adding the equations (1) and (2) to get the value of $YH_{x2}$ results:

$$YH_{x2} - a_1 \cdot x_2 + YH_{x2} - a_1 \cdot (l_9 - x_2) = YH_{8max} + YH_{9max}$$

$$2YH_{x2} - a_1 \cdot l_9 = YH_{8max} + YH_{9max}$$

$$2YH_{x2} = YH_{8max} + YH_{9max} + a_1 \cdot l_9 \quad (5)$$

Substituting the equation (5) into the equation (4) results:

$$2YH_{x2} = (YH_{8max} + YH_{9max}) + \frac{l_9}{l_{10}}(YH_{9max} - YH_{10max})$$

$$\therefore YH_{x2} = \quad (6)$$

$$\frac{1}{2}\left\{(YH_{8max} + YH_{9max}) + \frac{l_9}{l_{10}}(YH_{9max} - YH_{10max})\right\}$$

Substituting the equations (4) and (6) into the equation (1) to obtain $x_2$ results:

$$\frac{1}{2}\left\{(YH_{8max} + YH_{9max}) + \frac{l_9}{l_{10}}(YH_{9max} - YH_{10max})\right\} -$$

$$\left(\frac{YH_{9max} - YH_{10max}}{l_{10}}\right)x_2 = YH_{8max}$$

thereby $$x_2 = \frac{l_{10}}{2} \cdot \frac{(YH_{9max} - YH_{8max})}{(YH_{9max} - YH_{10max})} + \frac{l_9}{2} \quad (7)$$

According to this abnormality locating method, the spot of partial discharge can be determined easily and accurately from the detected signals of the three detectors $S_8$-$S_{10}$.

Figure 7:
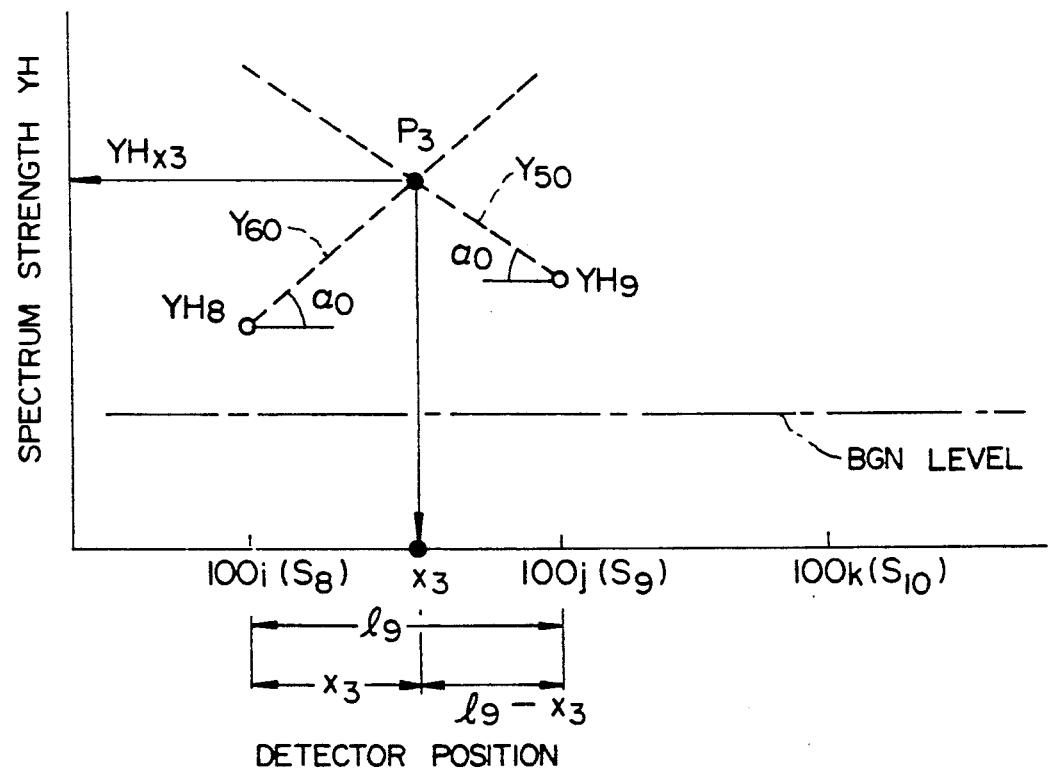
FIG. 7 is a diagram showing the inventive method of abnormality location based on the use of two detectors.

FIG. 7 shows a method of abnormality location of the case where only two of the detectors detect a partial discharge. This method is designed to determine the intersection $P_3$ of attenaution lines $Y_{60}$ and $Y_{50}$ for the spectrum strengths $YH_{8max}$ and $YH_{9max}$ provided by the detectors $S_8$ and $S_9$ by using a preset attenuation factor $\alpha_0$ thereby to locate the spot of partial discharge at point $x_3$ with a magnitude of $YH_{x3}$. The values of $YH_{x3}$ and $x_3$ can readily be calculated from the following equations that are derived from FIG. 7.

$$\begin{cases} YH_{x3} - \alpha_0 \cdot x_3 = YH_{8max} & (8) \\ YH_{x3} - \alpha_0 (l_9 - x_3) = YH_{9max} & (9) \end{cases}$$

Adding the equations (8) and (9) to get $YH_{x3}$ results:

$$2YH_{x3} - \alpha_0 \cdot x_3 - \alpha_0 \cdot l_9 + \alpha_0 \cdot x_3 = YH_{8max} + YH_{9max}$$

$$\therefore YH_{x3} = \frac{1}{2}(YH_{8max} + YH_{9max} + \alpha_0 \cdot l_9) \quad (10)$$

Subtracting the equation (9) from equation (8) to get $x_3$ results:

$$-\alpha_0 \cdot x_3 + \alpha_0 \cdot l_9 - \alpha_0 \cdot x_3 = YH_{8max} - YH_{9max}$$

$$\therefore x_3 = (YH_{9max} - YH_{8max}) \cdot \frac{1}{2 \cdot \alpha_0} + \frac{l_9}{2} \quad (11)$$

This abnormality locating method requires a minimal number of detectors, i.e., two detectors, for the location of an abnormality, allowing a drastic reduction of detectors.

The abnormality locating method explained in connection with FIG. 7 is also applicable to the results of detection explained on FIG. 4 through FIG. 6. The abnormality locating method explained in connection with FIG. 6 is also applicable to the results of detection explained on FIG. 4 through FIG. 5. Using more than one abnormality locating mode in combination further enhances the locating accuracy. The abnormality locating methods described above are applicable to the case where the detectors $S_0$–$S_n$ are disposed at an equal interval, and also to the case where they are disposed at unequal intervals.

Figure 8:
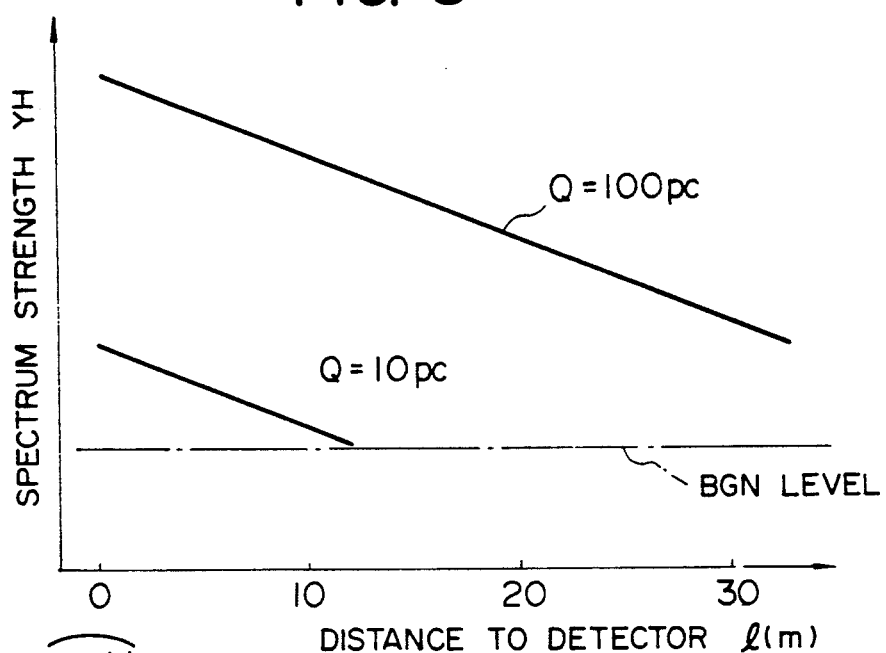
FIG. 8 is a characteristic diagram showing the fall in the detection level.

In the case of adopting the abnormality locating method for a small partial discharge described above, the disposition of each detector deserve to consider. The following explains the condition of disposition of detectors for locating a minimal partial discharge that needs to be detected, with reference to FIGS. 8, 9 and 10. FIG. 8 is a characteristic diagram showing the reduction of detection level, and FIGS. 9 and 10 are characteristic diagrams used to determine the positions where the detectors are placed.

FIG. 8 shows the variation of spectrum strength against the distance from the spot of partial discharge to the detector, indicating a linear reduction of the detector output in proportion to its distance from the spot of partial discharge. In the case of an amount of charge as relatively large as $Q=100$ pC (picocoulomb), a partial discharge can fairly be detected at a position with a distance of 30 m from the spot of partial discharge, while a minimum harmful partial discharge with $Q=10$ pC is undetected in a distance of 10 m or more. Accordingly, the figure reveals that the range of detection with a single detector for a partial discharge as weak as $Q=10$ pC is around 10 m.

Figure 9:
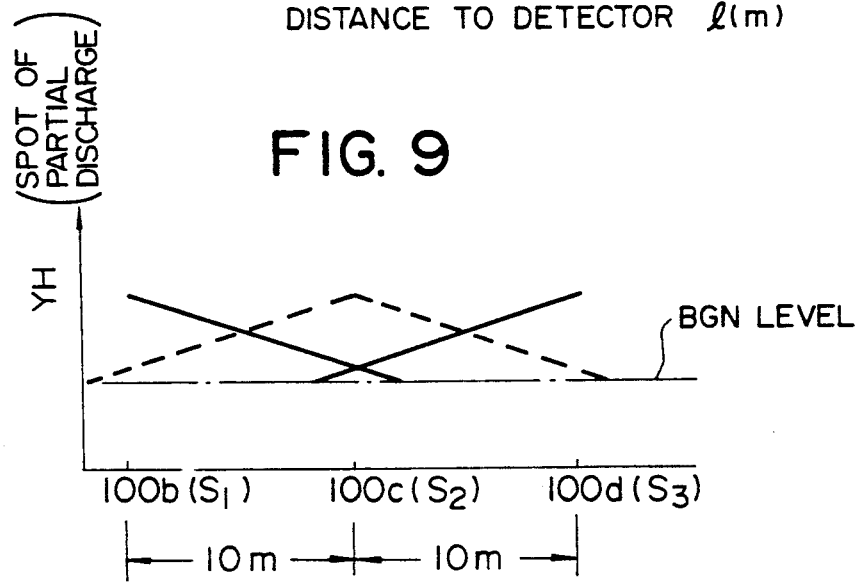
FIGS. 9 and 10 are characteristic diagrams for setting up the detector installation positions.

Based on this result of examination, the detectors $S_1$–$S_3$ are disposed at positions $100b$, $100c$ and $100d$ with a 10 m interval, as shown in FIG. 9. The detector $S_2$ placed at position $100c$ has its range of detection covering the the positions $100b$ and $100d$ of the detectors $S_1$ and $S_3$, as shown by the dashed line, and the detectors $S_1$ and $S_3$ placed at positions $100b$ and $100d$ have their detection ranges covering the position $100c$ of the detector $S_2$, as shown by the solid lines. Consequently, any partial discharge emerging between the positions $100b$ and $100c$ is always detected by two or more detectors, and therefore the spot of partial discharge can be located accurately by the method explained in connection with FIG. 7 or FIG. 6.

Figure 10:
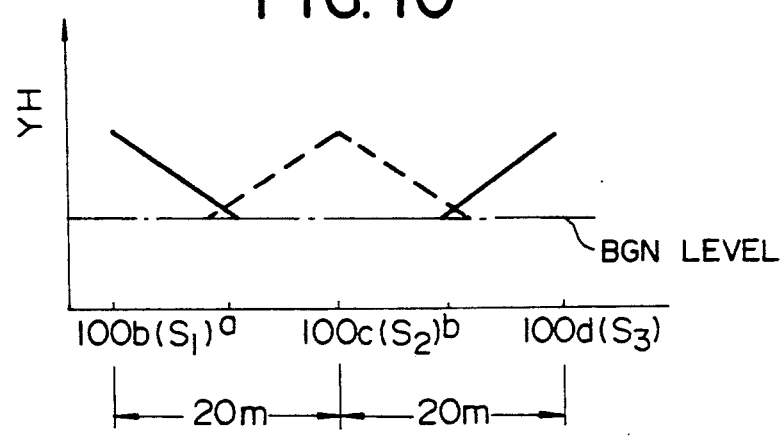

In FIG. 10, the detectors $S_1$–$S_3$ are disposed at positions $100b$–$100d$ with a 20 m interval, twice as long as the case of FIG. 9. Each detector has its range of detection for a partial discharge of $Q=10$ pC merely extending up to the medial point a or b between adjacent detectors, and any partial discharge emerging within the range of 40 m is always detected by one detector. For example, when a partial discharge is detected by the detector $S_1$ at position $100c$ and is not detected by the adjacent detectors $S_1$ and $S_3$ at positions $100b$ and $100d$, it can be determined that a partial discharge comparable to 10 pC is emerging somewhere between point a and point b. A partial discharge of several tens pC or above is detected by two or more detectors and it can be located accurately by the method explained in connection with FIGS. 6 and 7. The foregoing embodiment allows a drastic reduction in the number of detectors, and it is advantageous for the simplification and cost reduction of the abnormality locating apparatus.

The foregoing embodiments of abnormality location are intended for a gas-insulated electric device having a linear structure as shown in FIG. 1. Gas-insulated electric devices which are installed practically in substations have many branch sections, and the following describes the method and apparatus for locating an abnormality in a gas-insulated electric device of this type.

Figure 11:
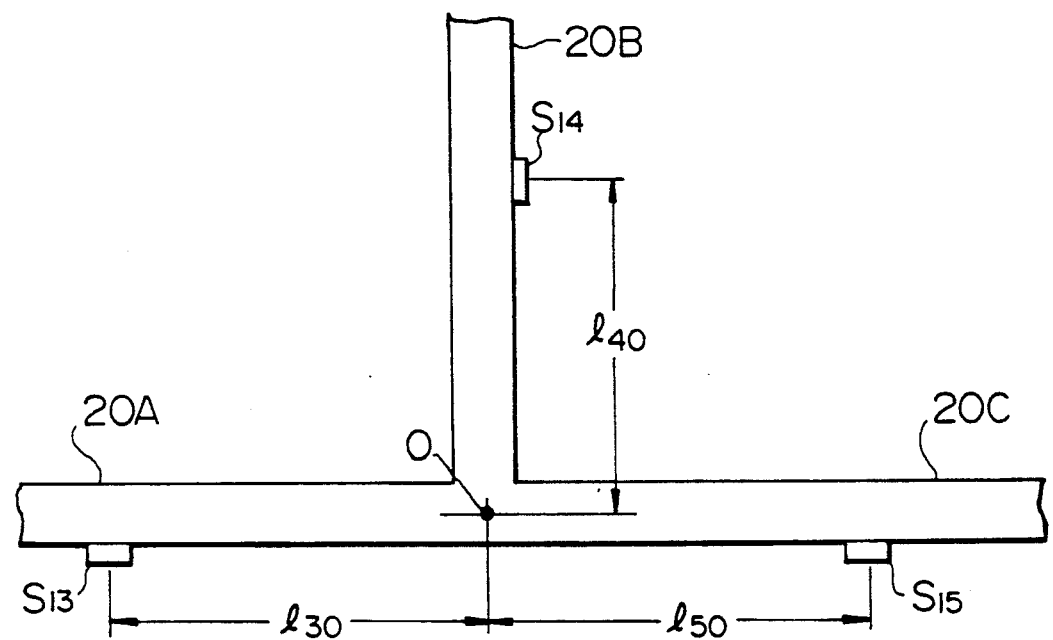
FIGS. 11 through 14 are diagrams each showing the disposition of detectors at a branch section of bus conductors in a gas-insulated electric device.

FIG. 11 shows a gas-insulated electric device in which bus conductors 20A, 20B and 20C are arranged in a reversed T-shape to include an orthogonal junction. A detector $S_{13}$ is disposed on the bus conductor 20A at a position with a distance of $l_{30}$ from the junction O, a detector $S_{14}$ is disposed on the bus conductor 20B at a position with a distance of $l_{40}$ from the junction O, and a detector $S_{15}$ is disposed on the bus conductor 20C at a position with a distance of $l_{50}$ from the junction O. In this example the distances from the junction O to the detectors are set to be $l_{30}=l_{40}=l_{50}$. The arrangement of the abnormality locating unit which is not shown here is identical to FIG. 1.

According to this arrangement of detectors, a detector providing a largest spectrum strength among those of the three detectors $S_{13}$–$S_{15}$ is determined in the same manner as of the preceding embodiment, and it is known that a partial discharge is emerging on the bus conductor where the detector is placed. It is also possible to locate the spot of partial discharge based on the combination of two detectors as explained on FIG. 7. In this case, if the detectors $S_{13}$–$S_{15}$ have revealed virtually equal spectrum strengths, a partial discharge is located to be in the vicinity of the junction O. By setting the distances to be:

$$l_{30} = l_{40} = l_{50} \leq 10 \text{ m} \tag{12}$$

it is possible to locate the emergence of a partial discharge as small as 10 pC, as have been explained in connection with FIGS. 9 and 10.

Figure 12:
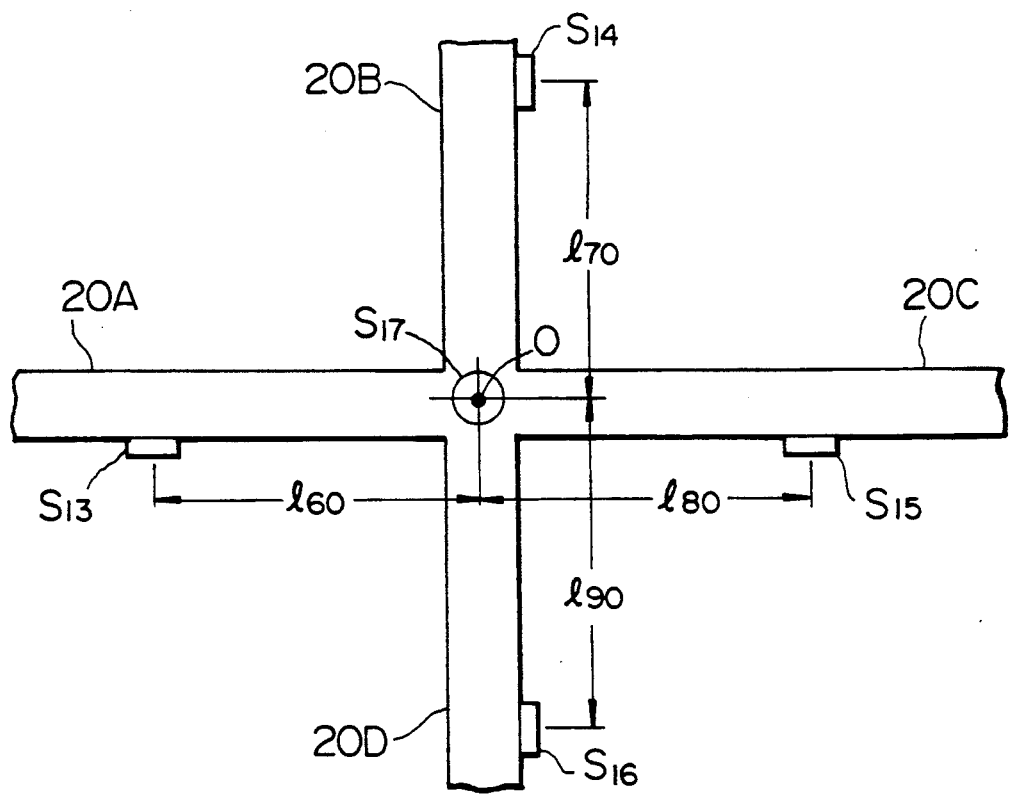

FIG. 12 shows a gas-insulated electric device having four bus conductors 20A-20D forming a crisscross junction. Detectors $S_{13}$-$S_{16}$ are disposed at positions with distances $l_{60}$-$l_{90}$, respectively, from the junction O of the bus conductors and another detector $S_{17}$ is disposed on the junction O, with output lines of the detectors being connected to the abnormality locating unit as shown in FIG. 1. Because of the additional detector $S_{17}$ placed on the junction O, the emerging direction of a partial discharge can be determined more accurately than the arrangement of FIG. 11. The distances $l_{60}$-$l_{90}$ between the junction O and the respective detectors may be equal or not. By setting these distances within 10 m, it is possible to locate a partial discharge with an amount of charge as small as 10 pC.

Figure 13:
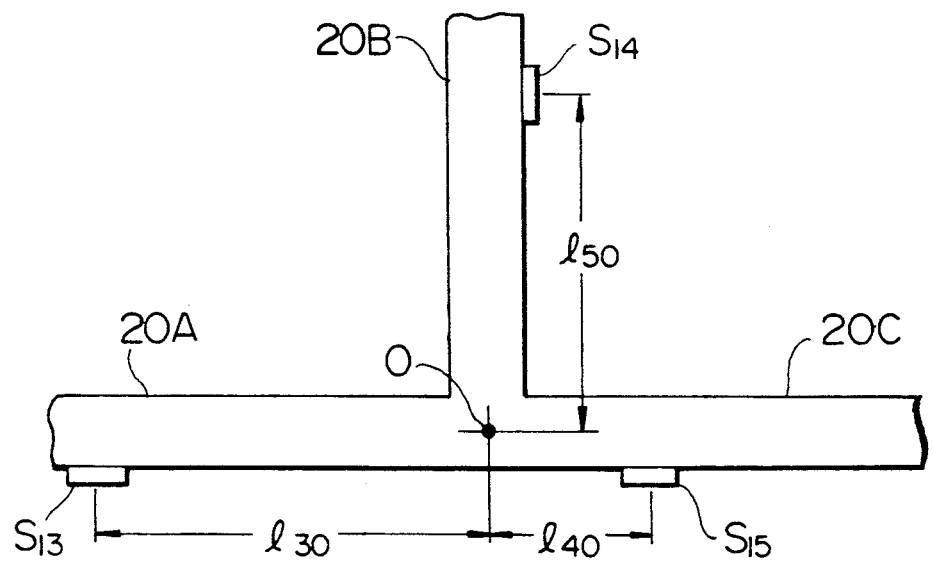
Figure 14:
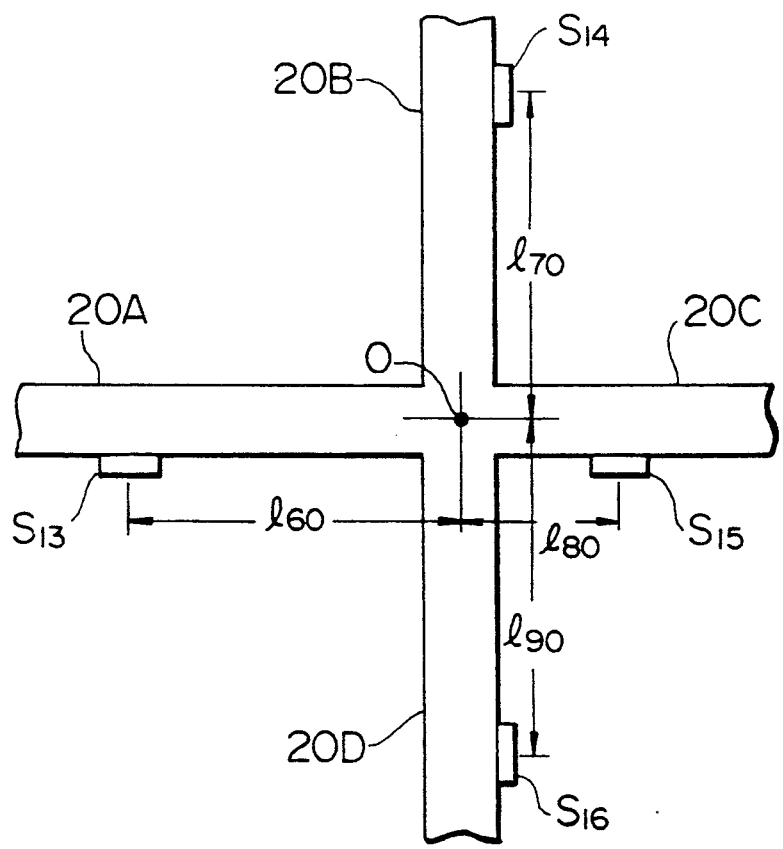

FIGS. 13 and 14 show gas-insulated electric devices derived from those of FIGS. 11 and 12, with modifications being made such that the detectors have different distances to the junction O, with the distances between the detector $S_{15}$ nearest to the junction and the remaining detectors being set within 20 m. Namely, the distance conditions of FIG. 13 are:

$$l_{30} + l_{40} \leq 20 \text{ m} \tag{13}$$

$$l_{40} + l_{50} \leq 20 \text{ m} \tag{14}$$

The distance conditions of FIG. 14 are:

$$l_{60} + l_{80} \leq 20 \text{ m} \tag{15}$$

$$l_{70} + l_{80} \leq 20 \text{ m} \tag{16}$$

$$l_{80} + l_{90} \leq 20 \text{ m} \tag{17}$$

These arrangements enable to determine the emerging direction, location and magnitude of a partial discharge based on two signals provided by a detector which detects the largest spectrum strength and the detector $S_{15}$ placed nearest to the junction O, in the same manner as the preceding embodiment of the case of two acting detectors explained on FIG. 7.

Figure 15:
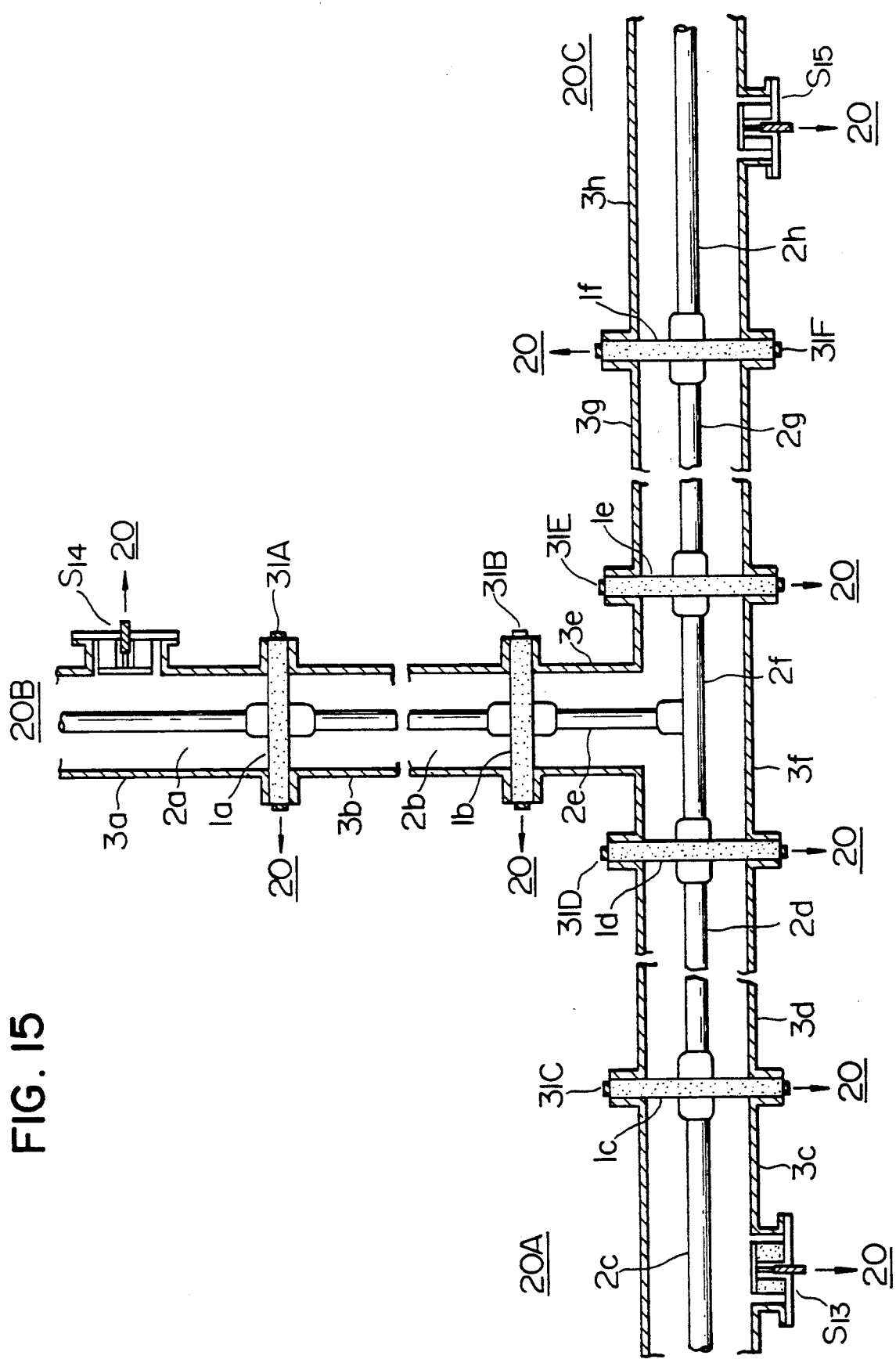
FIG. 15 is a cross-sectional diagram of the gas-insulated electric device using the apparatus for abnormality location according to the second embodiment of this invention.

FIG. 15 shows the abnormality locating apparatus for a gas-insulated electric device according to the second embodiment of this invention. A practical gas-insulated electric device has the provision of insulation support members 1a-1f which separate a plurality of metallic containers 3a-3h, and is arranged to have a branch section, with high-voltage conductors 2a-2h being supported by the insulation support members, as shown in the figure. Three bus conductors 20A-20C extending linearly from the junction of the branch section are provided with detectors $S_{13}$-$S_{15}$ each arranged as shown in FIG. 2, with the output terminals thereof being connected to the abnormality locating unit 20 shown in FIG. 1. The insulation support members 1a-1f have their externally exposed surfaces provided with additional band-shaped detection electrodes 31A-31F, whose output terminals are connected to the abnormality locating unit 20. These detection electrodes 31A-31F serve to detect electromagnetic waves generated in the metallic containers 3a-3h due to a partial discharge and propagated from the flange section of insulation support members 1a-1f to the outside. Although the detection electrodes 31A-31F are less sensitive than the foregoing detectors $S_{13}$-$S_{15}$, they have a sensitivity of several tens pC for a nearby partial discharge.

By introducing the detected signals of the detection electrodes 31A-31F, as well as the detected signals of the high-sensitivity detectors $S_{13}$-$S_{15}$, to the abnormality locating unit 20 thereby to analyze the propagating characteristics of the electromagnetic waves between the detectors, the abnormality location accuracy can further be enhanced.

Figure 16:
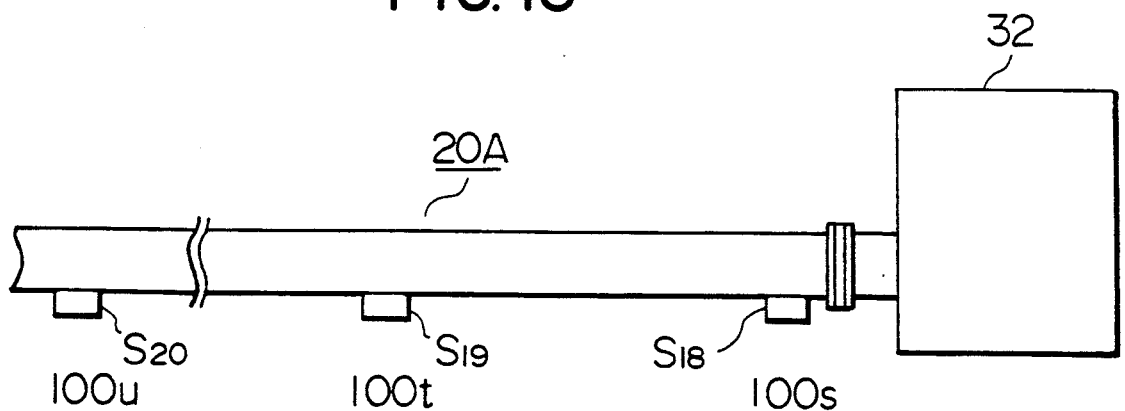
FIG. 16 is a front view of the gas-insulated electric device using the apparatus for abnormality location according to the third embodiment of this invention.

FIG. 16 shows the abnormality locating apparatus for a gas-insulated electric device according to the third embodiment of invention, in which a transformer 32 which is an oil-containing electric device is connected to a gas-insulated bus conductor 20A which is a gas-insulated electric device. Disposed on the gas-insulated device are a detector $S_{18}$ located closed to the transformer 32 and a plurality of detectors $S_{19}$-$S_{20}$ located on the opposite side of the detector $S_{18}$ seen from the transformer.

Figure 17:
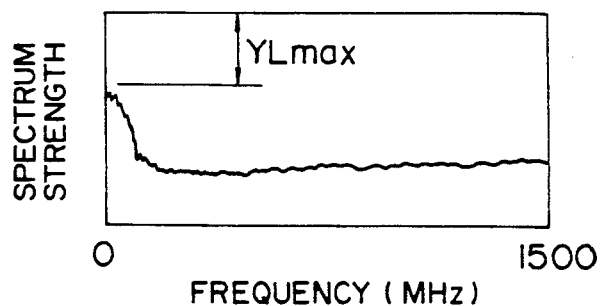
FIG. 17 is a characteristic diagram showing the frequency spectrum of the apparatus shown in FIG. 16.
Figure 18:
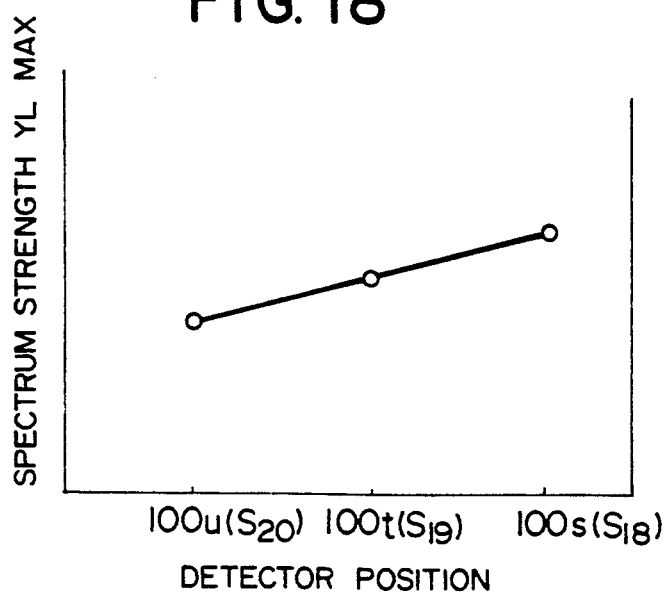
FIG. 18 is a diagram showing the inventive method of abnormality location.

According to the abnormality locating apparatus of this arrangement, a partial discharge emerging inside the transformer 32 is detected by three detectors $S_{18}$-$S_{20}$. The detected signals reveal a pattern of frequency spectrum having a high magnitude of low-frequency components as shown in FIG. 17, with the low-frequency spectrum strength $YL_{max}$ diminishing in proportion to the distance of detector from the transformer 32 as shown in FIG. 18. Accordingly, at the connection with the transformer 32, it is possible to distinguish a partial discharge on the gas-insulated bus conductor 20A and a partial discharge on the part of the transformer 32 on the basis of the low-frequency spectrum strength $YL_{max}$.

Figure 19:
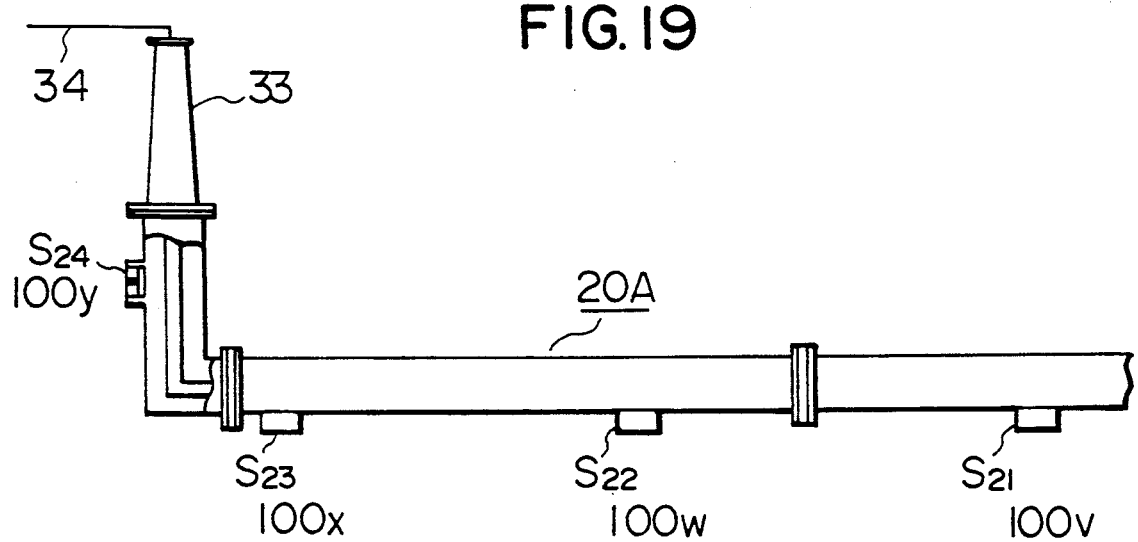
FIG. 19 is a front view of the gas-insulated electric device using the inventive apparatus for abnormality location.
Figure 20:
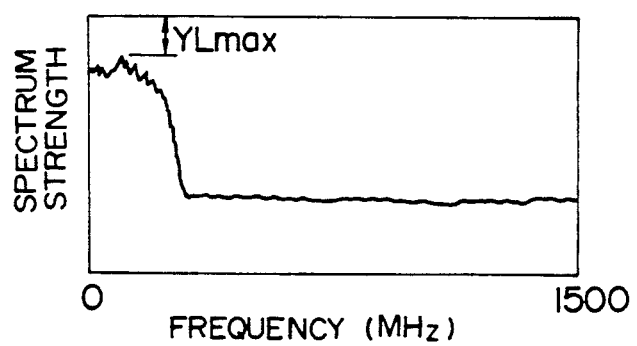
FIG. 20 is a characteristic diagram showing the frequency spectrum of the apparatus shown in FIG. 19.
Figure 21:
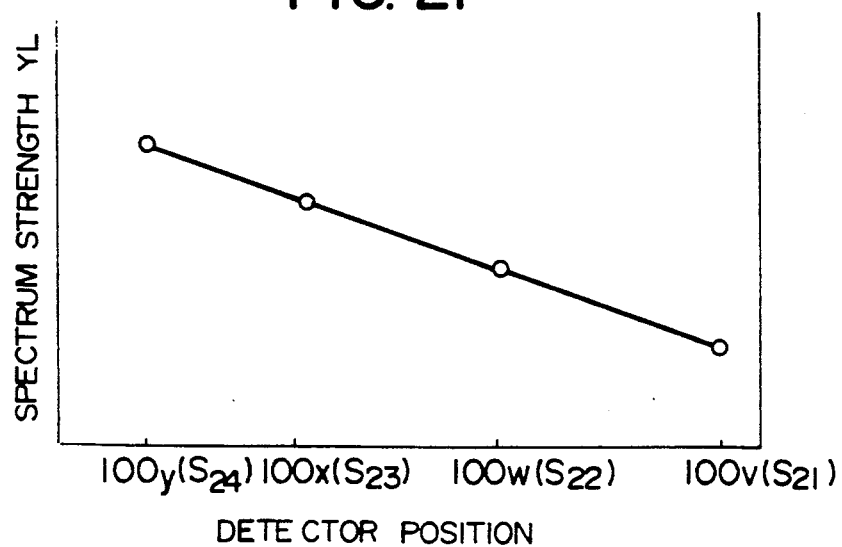
FIG. 21 is a diagram showing the method of abnormality location based on the apparatus shown in FIG. 19.

FIG. 19 shows the abnormality locating apparatus for a gas-insulated electric device according to the fourth embodiment of this invention, in which an air bushing 33 is provided at an end of a gas-insulated bus conductor 20A, which is a gas-insulated electric device, and the bus conductor is connected to a power transmission line 34 through the air bushing 33. A detector $S_{24}$ is disposed on the bus conductor 20A at position $100y$ close to the air bushing 33, and detectors $S_{23}$-$S_{21}$ are disposed at positions $100x$-$100v$ that are increasingly farther than $100y$ from the bushing. This arrangement enables the detectors to detect even an external partial discharge emerging on the power line 34 and air bushing 33 in the same manner as for a partial discharge on the gas-insulated bus conductor 20A which is a gas-insulated electric device. High-frequency components of the external partial discharge are attenuated during the propagation into the metallic container of the gas-insulated bus conductor 20A, and therefore the measured frequency spectrum has its low-frequency components emphasized as shown in FIG. 20. In addition, since the low-frequency spectrum strength $YL_{max}$ of detector $S_{21}$-$S_{24}$ falls as the detector position goes away from the air bushing 33 as shown in FIG. 21, it is possible to locate a partial discharge on the gas-insulated bus conductor 20A separately from an external partial discharge. By utilizing the opposite gradients of the characteristics shown in FIG. 18 and FIG. 21, even a partial discharge emerging outside the gas-insulated bus conductor 20A can be located separately on the part of the transformer or on the part of the air bushing.

Figure 22:
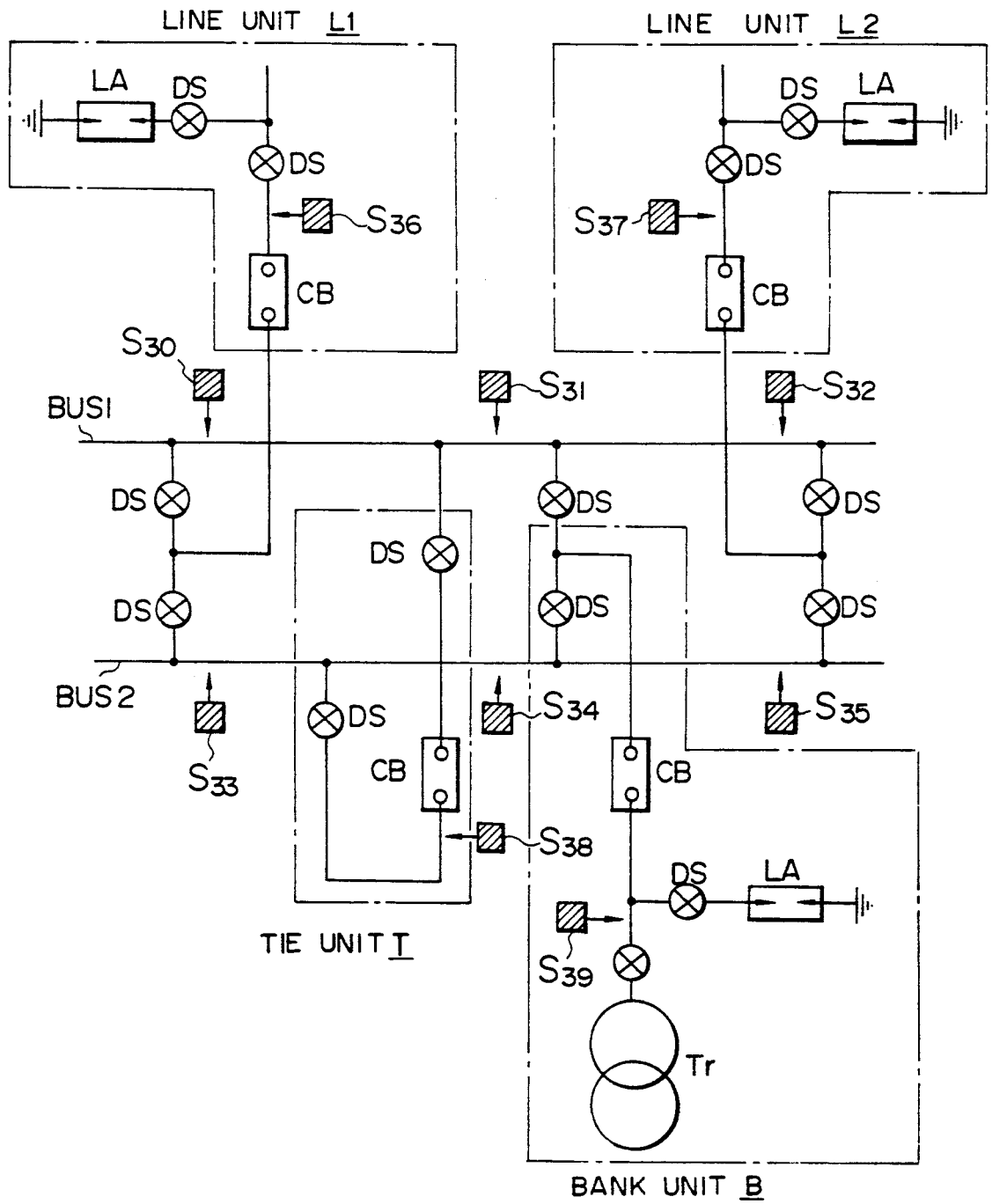
FIG. 22 is a schematic wiring diagram of the gas-insulated switch device of a substation equipped with the inventive abnormality locating apparatus.

FIG. 22 is a schematic connection diagram of a substation which employs gas-insulated switch devices using the inventive abnormality locating apparatus. In the figure, dual main buses BUS1 and BUS2 are connected with line units L1 and L2, a tie unit T, and a bank unit B. Each unit of connection constitutes a generally known gas-insulated switch device formed in combination of disconnecting switches DS, a circuit breaker CB, a lightening arrester LA, a transformer Tr, and buses which connect these devices. Detectors $S_{30}$-$S_{39}$ of the abnormality locating apparatus are disposed at virtually symmetrical positions in the system with respect to the dual main buses BUS1 and BUS2, as shown in FIG. 22. Specifically, detectors $S_{30}$ and $S_{33}$ are placed between the line unit L1 and tie unit T, detectors $S_{31}$ and $S_{34}$ are placed between the tie unit T and bank unit B, detectors $S_{32}$ and $S_{35}$ are placed between the bank unit B and line unit L2, a detector $S_{36}$ is placed by the circuit breaker CB on the side opposite to the main bus in the line unit L1, a detector $S_{38}$ is placed at one end of the circuit breaker CB in the tie unit T, a detector $S_{39}$ is placed by the circuit breaker CB on the side opposite to the main bus in the bank unit B, and a detector $S_{37}$ is placed by the circuit breaker CB on the side opposite to the main bus in the line unit L2. By this arrangement of detectors, the overall system can be monitored with a relatively small number of detectors.

Figure 23:
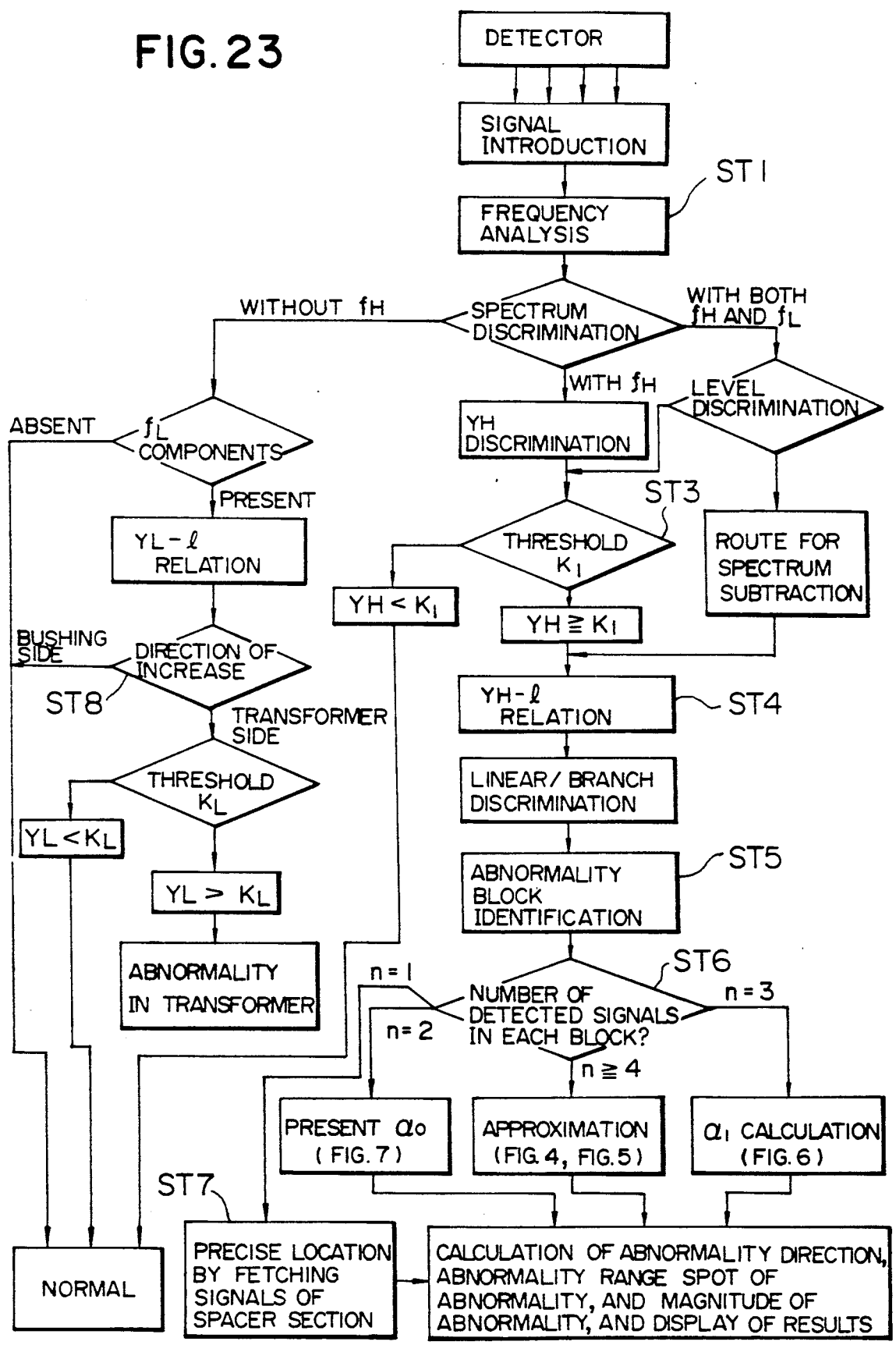
FIG. 23 is a flowchart which summarizes the inventive method of abnormality location based on the above embodiments.

FIG. 23 is a basic operational flowchart of the abnormality locating system operative in the foregoing various locating modes, and the following explains the operation in brief.

Detected signals sent from all detectors are subjected to frequency spectral analysis in step ST1. The next step ST2 discriminates the frequency components of each signal and branches the process into three routes. The first route is the case of only low-frequency components $f_L$ without including high-frequency components $f_H$, in which step ST8 examines the direction of increase in the spectrum strength thereby to discriminate the signal to be an internal abnormality of the transformer or an external noise on the part of the air bushing, in accordance with the locating method shown in FIGS. 18 and 21. The second route is the case of only high-frequency components, in which step ST3 compares the detected spectrum strength $YH_{max}$ with the preset threshold value $K_1$ of the harmful level. If the spectrum strength is below the threshold value, the system is judged to be normal, or if it is at or above the threshold value, the next step ST4 verifies the relation between the detector position l and spectrum strength YH thereby to discriminate whether the event is at a linear section or branch section. The next step ST5 identifies blocks in which abnormality signals are detected. For example, in case abnormalities emerge at two spots in the system, there should be two groups of detectors that detect abnormality signals. The next step ST6 verifies the number n of detected signals in each abnormality block, and branches the process into four routes according to the number n. In the case of n=1, the spot of abnormality is judged to be close to the detector that has detected the signal. In order to locate the spot more accurately, step ST7 introduces signals from the detection electrodes 31A-31F provided on the nearby insulation support members 1a-1f, such as insulation spacers, as shown in FIG. 15. For the remaining routes of the cases of n=2, n≧4 and n=3, abnormality locating processes are implemented as shown in FIG. 7, FIGS. 4 and 5, and FIG. 6, respectively, with the result of each process being displayed.

Returning to the spectrum analysis in step ST2, the third route for the coexistence of high-frequency components $f_H$ and low-frequency components $f_L$ proceeds to the above-mentioned step ST3 if $f_H \geq f_L$, or in the case of $f_H < f_L$ the process is routed to the spectrum subtraction process disclosed in Japanese Patent Application No. 63-103936 filed by the same applicant of the present invention, in which the event of abnormality is verified and, in the case of abnormality, the sequence proceeds to the above-mentioned step ST4 for the case of sole high-frequency components.

This abnormality locating system is based on a computer system, which achieves the enhanced accuracy of abnormality location, drastically reduced processing time for abnormality location, and automated monitoring against abnormalities.

Figure 24:
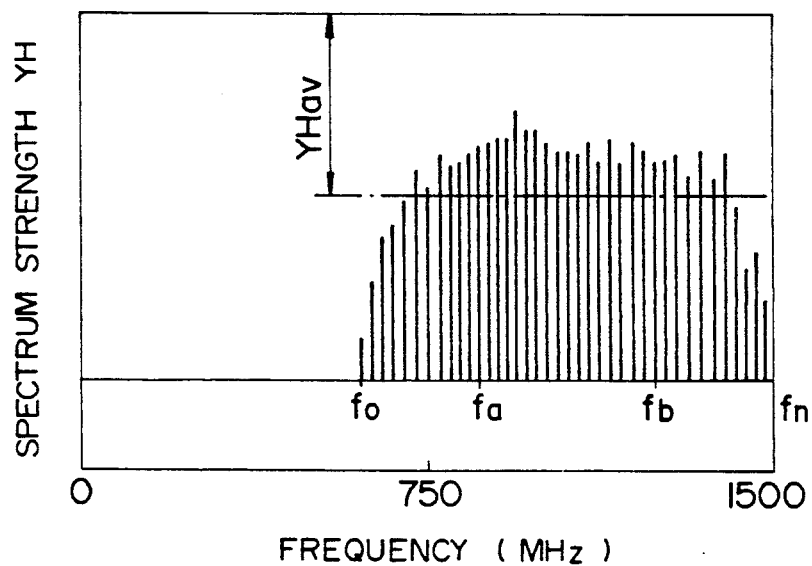
FIG. 24 and FIG. 25 are characteristic diagrams of the frequency spectrum based on another embodiment of this invention for evaluating the spectrum strength.
Figure 25:
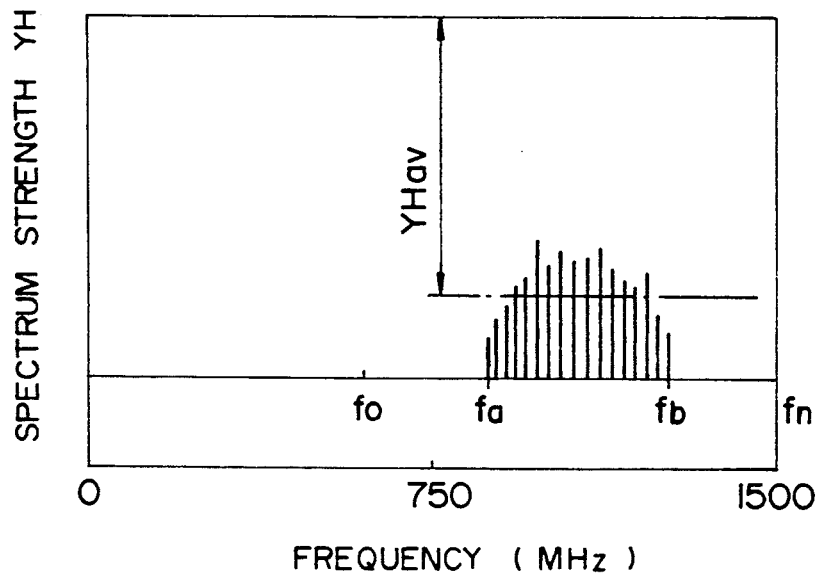

FIGS. 24 and 25 show another embodiments of this invention for evaluating the spectrum strength from the frequency spectrum of a detected signal. Among the frequency spectrum of each figure, spectrum strengths at certain frequencies $f_0$-$f_n$ or $f_a$-$f_b$ are averaged to obtain $YH_{av}$ for use as a level of each detected signal. The averaging process may be designed to cover all spectrum strengths in the detection frequency band, or to have its range confined from the first to n-th peak strength, or to sample frequencies at a certain interval. Based on the characteristics, as shown in the frequency spectrum of FIG. 25, that components of frequencies $f_0$-$f_a$ and $f_b$-$f_n$ diminish significantly and components of frequencies $f_a$-$f_b$ remain as the propagation distance is prolonged, it is also possible to confine the detection of each detector to a certain frequency band before conducting the averating process. This scheme provides a very stable attenuation characteristics, as compared with the case of using the largest value $YH_{max}$ of spectrum strength shown in FIG. 3, and the abnormality locating accuracy can further be enhanced.

The inventive method and apparatus for locating an abnormality in a gas-insulated electric device, as described above, use detectors for detecting an electromagnetic wave caused by a partial discharge and operate to locate the largest spectrum strength as the spot of partial discharge by utilization of the attenuating characteristics of the electromagnetic wave in the metallic container, whereby highly sensitive and accurate abnormality location can be accomplished.

The inventive abnormality locating method necessitates a minimal number of detectors, and the number of detectors can be reduced drastically.

The inventive abnormality locating method is capable of locating an abnormality in an associated device such as a transformer.

The inventive abnormality locating method is capable of carrying out prompt abnormality location for checking and repair, leaving other sections intact, whereby the repairing activity is simplified.

We claim:

1. A method of locating an abnormality in a gas-insulated electric device, in which a high-voltage conductor is supported by an insulation support member inside a metallic container filled with insulation gas, operative to locate the spot of a partial discharge emerging in said metallic container by means of a plurality of detectors ($S_0$-$S_n$) installed at positions within said metallic container and which detect the partial discharge, wherein said detectors detect an electromagnetic wave caused by the partial discharge, the frequency spectrum of the electromagnetic wave is analyzed to evaluate the spectrum strength (YH), a position (x) which renders a maximum spectrum strength is determined from the relation between spectrum strengths of said detectors and installation positions of said detectors and an attenuation factor ($\alpha$) of said electromagnetic wave generated and traveling within said metallic container, and said position (x) is determined in a longitudinal direction of said metallic container to be the spot of the partial discharge.

2. An abnormality locating method according to claim 1, wherein said position (x) of maximum spectrum strength is derived from a position of a peak value of an envelope curve of said spectrum strengths (YH) provided by said detectors plotted against the installation positions ($100a$-$100n$) of said detectors.

3. An abnormality locating method according to claim 1, wherein said position (c) of maximum spectrum strength is determined such that four contiguous detectors including a detector which provides a largest spectrum strength are selected from among said detectors ($S_0$-$S_n$), a pair of lines are drawn based on the installation positions and spectrum strengths of two pairs of adjoining detectors, and the intersection ($P_1$) of said lines is determined to be the position (x) of maximum spectrum strength.

4. An abnormality locating method according to claim 1, wherein said position (x) of maximum spectrum strength is determined such that a detector ($S_9$) which provides a largest spectrum strength and two detectors $S_8$, $S_{10}$ adjacent to $S_9$ are selected from among said detectors ($S_0$, $S_n$), a pair of lines are drawn based on an attenuation factor ($\alpha_1$) evaluated from a largest spectrum strength ($YH_9$) and a smallest spectrum strength ($YH_{10}$) among the selected detectors and the installation positions and spectrum strengths of the detectors, and the intersection ($P_2$) of said lines is determined to be the position (x) of maximum spectrum strength.

5. An abnormality locating method according to claim 4, wherein said position (x) of maximum spectrum strength is determined as follows: when said contiguous detectors ($S_8$-$S_{10}$) provide spectrum strengths of $YH_{8max}$, $YH_{9max}$ and $YH_{10max}$, respectively, where $YH_{9max} > YH_{8max} > YH_{10max}$; said detectors $S_8$ and $S_9$ have a distance of $l_9$; said detectors $S_9$ and $S_{10}$ have a distance of $l_{10}$; the position of maximum spectrum strength $YH_{x2}$ is $x_2$; the attenuation factor of an electromagnetic wave caused by the partial discharge during the propagation in said metallic container is $\alpha_1$, then the following equations (1) to (3) hold:

$$YH_{x2} - \alpha_1 \cdot x_2 = YH_{8max} \quad (1)$$

$$YH_{x2} - \alpha_1 \cdot (l_9 - x_2) = YH_{9max} \quad (2)$$

$$YH_{x2} - \alpha_1 \cdot )l_9 + l_{10} - x_2) = YH_{10max} \quad (3)$$

said attenuation factor $\alpha_1$ is calculated as:

$$\alpha_1 = \frac{YH_{9max} - YH_{10max}}{l_{10}} \quad (4)$$

the maximum spectrum strength $YH_{x2}$ is calculated as:

$$YH_{x2} = \quad (6)$$

$$\frac{1}{2} \left\{ (YH_{8max} + YH_{9max}) + \frac{l_9}{l_{10}} (YH_{9max} - YH_{10max}) \right\}$$

and the position $x_2$ of maximum spectrum strength is calculated as:

$$x_2 = \frac{l_{10}}{2} \cdot \frac{(YH_{9max} - YH_{8max})}{(YH_{9max} - YH_{10max})} + \frac{l_9}{2} \quad (7)$$

6. An abnormality locating method according to claim 1, wherein said position (x) of maximum spectrum strength is determined such that a detector ($S_9$) which provides a largest spectrum strength and a detector ($S_8$) adjacent to ($S_9$) are selected from among said detectors ($S_0$-$S_n$), a pair of lines are drawn based on a predetermined attenuation factor ($\alpha_0$) and the installation position and spectrum strengths of the detectors, and the intersection ($P_3$) of said lines is determined to be the position (x) of maximum spectrum strength.

7. An abnormality locating method according to claim 6, wherein said position (x) of maximum spectrum strength is determined as follows: when said adjoining detectors ($S_8$, $S_9$) provide spectrum strengths of $YH_{8max}$ and $YH_{9max}$, respectively; said detectors $S_8$ and $S_9$ have a distance of $l_9$; the position of maximum spectrum strength $YH_{x3}$ is $x_3$; the predetermined attenuation factor is $\alpha_0$; then the following equations (8) and (9) hold:

$$YH_{x3} - \alpha_0 \cdot x_3 = YH_{8max} \quad (8)$$

$$YH_{x3} - \alpha_0 \cdot (l_9 - x_3) = YH_{9max} \quad (9)$$

the maximum spectrum strength $YH_{x3}$ is calculated as:

$$YH_{x3} = \tfrac{1}{2}(YH_{8max} + YH_{9max} + \alpha_0 \cdot l_9) \quad (10)$$

and the position $x_3$ of maximum spectrum strength is calculated as:

$$x_3 = (YH_{9max} - YH_{8max}) \cdot \frac{1}{2 \cdot \alpha_0} + \frac{l_9}{2} \quad (11)$$

8. An abnormality locating method according to claim 1, wherein said metallic container has a linear structure section and said detectors are disposed in said linear section at an interval of 20 m or less.

9. An abnormality locating method according to claim 1, wherein said metallic container has a branch structure section and, among said detectors ($S_0$-$S_n$), a detector ($S_{15}$) is disposed at a position close to the center (O) of said branch section and the remaining detectors are disposed at positions within 20 m from said detector ($S_{15}$).

10. An abnormality locating method according to claim 1, wherein said gas-insulated electric device has a branch section and said detector ($S_{17}$) is disposed at a position which is virtually the center (O) of said branch section.

11. An abnormality locating method according to claim 1, wherein said gas-insulated electric device has a branch structure section and at least one detector ($S_{15}$) is disposed at a position which is virtually the center (O) of said branch section.

12. An apparatus of locating an abnormality in a gas-insulated electric device, in which a high-voltage conductor is supported by an insulation support member inside a metallic container filled with insulation gas, operative to locate the spot of a partial discharge emerging in said metallic container by means of a plurality of detectors ($S_0$-$C_n$) installed at positions within said metallic container and which detect the partial discharge, wherein said apparatus comprises at least two detectors disposed with a certain distance therebetween for detecting an electromagnetic wave cause by the partial discharge; means for analyzing the frequency spectrum of signals provided by said detectors thereby to evaluate the spectrum strengths; and means for locating the spot of the partial discharge on the basis of a maximum spectrum strength determined from the comparison of the spectrum strengths provided by said detectors and installation positions of said detectors and an attenuation factor of said electromagnetic wave generated and traveling within said metallic container.

13. Abnormality locating apparatus according to claim 12, wherein said metallic container has a linear structure section and said detectors ($S_0$-$S_n$) are disposed in said linear section at an interval of 20 m or less.

14. An abnormality locating apparatus according to claim 12, wherein said metallic container has a branch structure section and, among said detectors ($S_0S_n$), a detector ($S_{15}$) is disposed at a position close to the center (O) of said branch section and the remaining detectors are disposed at positions within 20 m from said detector ($S_{15}$).

15. An abnormality locating apparatus according to claim 12, wherein said gas-insulated electric device has a branch section and said detector ($S_{17}$) is disposed at a position which is virtually the center (O) of said branch section.

16. An abnormality locating apparatus according to claim 12, wherein said gas-insulated electric device has a branch structure section and at least one detector ($S_{15}$) is disposed at a position which is close to the center (O) of said branch section.

* * * * *